United States Patent [19]
Shimazaki

[11] Patent Number: 5,831,317
[45] Date of Patent: Nov. 3, 1998

[54] SEMICONDUCTOR DEVICE AND MANUFACTURE THEREOF

[75] Inventor: Takaaki Shimazaki, Souraku-gun, Japan

[73] Assignee: Matsushita Electronics Corporation, Japan

[21] Appl. No.: 941,218

[22] Filed: Oct. 1, 1997

Related U.S. Application Data

[63] Continuation of Ser. No. 66,793, May 25, 1993, abandoned.

[51] Int. Cl.$^6$ ..................................................... H01L 29/76
[52] U.S. Cl. ........................................... 257/401; 257/408
[58] Field of Search ................................... 257/401, 408, 257/536

[56] References Cited

U.S. PATENT DOCUMENTS 4,710,791  12/1987  Shirato et al. ........................... 257/533

FOREIGN PATENT DOCUMENTS 0176752  3/1989  Japan ...................................... 257/536

*Primary Examiner*—Mark V. Prenty
*Attorney, Agent, or Firm*—Rogers & Wells LLP

[57] ABSTRACT

A high breakdown voltage semiconductor device is formed in a desired region on a semiconductor substrate. An impurity diffusion layer 32 is disposed at the center of the high breakdown voltage semiconductor device. The impurity diffusion layer 32 has a rounded or semi-circular configuration at both ends thereof having a particular curvature. The impurity diffusion layer 32 serves as drain. An impurity diffusion layer 33 is formed in the neighborhood and periphery of the impurity diffusion layer 32. The width of a portion 33b of the impurity diffusion layer 33 in abutting relation with the two semi-circular end portions of the impurity diffusion layer 32 is wider than that of a remaining portion 33a of the impurity diffusion layer 33 in abutting relation with longitudinal sides of the impurity diffusion layer 32. The rounded end portions of the impurity diffusion layer 32 have a larger curvature than the longitudinal side portions thereof. In other words, the width of the portion 33b of the impurity diffusion layer 33 in abutting relation on the much-curved region of the impurity diffusion layer 32 is wider than that of the remaining portion 33a in abutting relation on the less-curved region of the impurity diffusion layer 32. In a given example, the width of the portion 33b of the impurity diffusion layer 33 having a smaller curvature is 3 $\mu$m and that of the remaining portion 33a thereof is 4 $\mu$m.

8 Claims, 10 Drawing Sheets

SEMICONDUCTOR DEVICE AND MANUFACTURE THEREOF

This is a continuation of application Ser. No. 08/066,793, filed May 25, 1993, now abandoned.

BACKGROUND OF THE INVENTION

A. Field of the Invention

The present invention relates to a semiconductor device for use in an output circuit in a semiconductor integrated circuit and a method of manufacture thereof, and more particular to a high breakdown voltage and high accuracy semiconductor resistor device and a method of manufacture thereof.

B. Description of the Related Prior Art

Recently, high breakdown voltage semiconductor devices have been in wide use in output circuits for directly enabling fluorescent tubes through the use of microcomputer chips.

As the IC technology has advanced toward miniaturization of semiconductor integrated circuit chips, the demand has been increased for miniaturization and high performance of high breakdown voltage semiconductor devices. Therefore, high breakdown voltage semiconductor devices have been in great demand which meet the requirements of high breakdown voltage and large current drive power even in miniaturized device structures.

With the advent of high performance semiconductor integrated circuit chips, high breakdown voltage and high accuracy semiconductor resistor devices have become indispensable. In particular, it is desirable that semiconductor resistor devices disposed at input and output terminals of microcomputer chips for directly enabling fluorescent tubes be implemented to meet the requirements of high breakdown voltage and high accuracy with the state-of-art CMOS process technique without additional expenditures.

FIG. 12 is a plain view of a conventional high voltage semiconductor device and FIG. 13 is a cross sectional view along the line AB in FIG. 12.

Referring to FIGS. 12 and 13, an insulating layer 2 is disposed on a semiconductor substrate 1. A gate electrode 3 is disposed over the semiconductor substrate 1 via the insulating layer 2, which electrode is ring shaped. An impurity diffusion layer 4 is formed on a surface of the semiconductor substrate 1 and positioned within the ring-shaped gate electrode 3. The impurity diffusion layer 4 has a predetermined width a ring shape. A second impurity diffusion layer 5 is formed on the surface of the semiconductor substrate 1 and placed inside the ring-shaped impurity diffusion layer 4. The impurity diffusion layer 5 serves as drain. A third impurity diffusion layer 6 is formed on the surface of the semiconductor substrate 1 and placed outside the ring-shaped gate electrode 3. The impurity diffusion layer 6 serves as source.

The above described and illustrated high breakdown voltage semiconductor device operates as follows:

When the high breakdown voltage semiconductor device is in non-conducting state and high voltage is applied to the impurity diffusion layer 5, the impurity diffusion layer 4 having a relatively lower impurity concentration becomes into a depletion layer. This causes a voltage drop in the impurity diffusion layer 4. As a result, a voltage determinative of the breakdown voltage of the semiconductor device, i.e., a voltage across a PN junction between the semiconductor substrate 1 beneath the ring-shaped gate electrode 3 and the impurity diffusion layer 4 is lower than the voltage applied to the impurity diffusion layer 5 to satisfy the high breakdown voltage requirement. It is, however, noted that the voltage drop is smaller with a smaller width of the impurity diffusion layer 4.

On the other hand, when the high breakdown voltage semiconductor device is in conducting state and high voltage is applied to the impurity diffusion layer 5, current runs from the impurity diffusion layer 6 to the impurity diffusion layer 5 via the impurity diffusion layer 4. With a decrease in the width of the impurity diffusion layer 4, the parasitic resistance therein is smaller to increase the current drive power of the high breakdown voltage semiconductor device.

FIGS. 14($a$) to 14($d$) are cross sectional views illustrating the sequence of manufacture of a conventional semiconductor resistor device as described in Japanese Laid-open Heisei No. 2-168671. On a semiconductor substrate 10 there is disposed an underlying oxide layer 11 and phosphorus ion implantation is carried out. This is followed by oxidation and well drive-in to form a well region 12 (FIG. 14($a$)).

After removal of the oxide layer from the semiconductor substrate 10, a new underlying oxide layer 13 and a silicon nitride layer 14 are formed. With a resist 15 applied to the silicon nitride layer, the lithography technique effects patterning or definition of a field region. While the resist 15 remains as a mask, the silicon nitride layer 14 is patterned. Thereafter, boron ion implantation is carried out to form a channel stop for element isolation of a N channel transistor (FIG. 14($b$)).

A field oxide layer 16 is then formed for element isolation. At this time, boron is diffused to develop an impurity diffusion layer 17 which serves as a resistor. After the silicon nitride layer 14 and the underlying oxide layer 13 are removed, a gate oxide layer 18 is formed. A poly-silicon layer 20 is grown to cover approximately the whole of a field oxide layer 19 over the impurity diffusion layer 17, the field oxide layer being used as a resistor (FIG. 14($c$)).

Boron ion implantation is thereafter effected to form an impurity diffusion layer 21. This step is followed by disposition of interlayer isolation layers 22 and disposition of aluminum electrodes 23 on the impurity diffusion layer 21 (FIG. 14($d$)).

The above illustrated semiconductor device operates as below:

If the surface concentration of the well region 12 is increased due to the demand of miniaturization, the impurity concentration of the impurity diffusion layer 17 should be high enough to prevent punch-through and the diffusion depth is thus correspondingly is small. At this time a depletion layer developed by a PN junction with the impurity diffusion layer 17 turns the impurity diffusion layer 17 into a complete depletion layer. Under the circumstance, the impurity diffusion layer would manifest a high resistance of 1 MΩ or more. However, when a voltage is applied to the poly-silicon layer 20 to induce majority carriers in the impurity diffusion layer 17, a current will flow even if the impurity diffusion layer 17 has been turned into a complete depletion layer. This current run will prevent the impurity diffusion layer 17 from exhibiting an extreme high resistance. This manufacturing process permits the state-of-art CMOS process to make a semiconductor resistor device of a desired high resistance value (approximately, 70 KΩ) without additional manufacturing steps.

FIG. 15 depicts a way to simultaneously form an n type channel stop and a resistor 20 on a P type well 19 as taught by Japanese Laid-open Showa No. 60-109261. One end of the resistor 20 is electrically connected to an input terminal 21 and the other end thereof is connected to an input terminal 22 which forms a drain region.

The above illustrated high breakdown voltage semiconductor device is, however, disadvantageous in that an attempt to enhance current drive power by decreasing the width of the impurity diffusion layer 4 results in a decrease in breakdown voltage and an attempt to increase breakdown voltage by increasing the width of the impurity diffusion layer 4 results in a drop in current drive power.

Another disadvantage of the prior art semiconductor resistor device is that segregation or diffusion takes place during the formation of a field oxide layer 19 on the diffusion layer 17 serving as resistor or the succeeding thermal treatment to increase manufacturing variances in resistance value. In other words, the boron in the diffusion layer 17 is segregated into the field oxide layer 19 so that the impurity concentration on a surface of the diffusion layer 17 falls by approximately one digit.

In FIG. 15, the resistance variance is substantial because the resistor 20 is completely overlaid with the field oxide layer 23. Even if an attempt is made to compensate for such resistance variance, an impurity may not be implanted due to the presence of the field oxide layer 23. It is also difficult to satisfy high breakdown voltage requirement because the end of the resistor 20 is shallower than the diffusion depth of the input terminals 21, 22.

Accordingly, it is an object of the present invention to provide a high breakdown voltage semiconductor device having a sufficiently high breakdown voltage and a sufficiently large current drive power.

It is another object of the present invention to provide a high breakdown voltage and high accuracy semiconductor resistor device with a minimum of manufacturing variance in resistance value and a manufacture thereof.

III. SUMMARY OF THE INVENTION

To achieve the above mentioned object or objects, the present invention provides a semiconductor device which comprises a semiconductor substrate of a certain conductivity type, a gate electrode disposed on the semiconductor substrate via an insulating layer, a first impurity diffusion layer disposed on a surface of the semiconductor substrate and located inside the gate electrode, said first impurity diffusion layer having the opposite conductivity type to that of the semiconductor substrate, a second impurity diffusion layer disposed on the surface of the semiconductor substrate and located inside the first impurity diffusion layer, said second impurity diffusion layer having the opposite conductivity type to that of the semiconductor substrate, wherein the first impurity diffusion layer has different curvatures at the boundary between the first and second impurity diffusion layers and wherein the width of a portion of the first impurity diffusion layer having a larger curvature is greater than that of another portion of the first impurity diffusion layer having a smaller curvature.

The second impurity diffusion layer has a round configuration at both end portions thereof.

The curvature of the remaining portion of the second impurity diffusion layer other than the end portions is substantially zero.

The portion of the first impurity diffusion layer in contact with the rounded end portions of the second impurity diffusion layer is wider than the remaining portion of the first impurity diffusion layer in contact with the remaining portion of the second impurity diffusion layer.

Further, the impurity concentration of the second impurity diffusion layer is higher than that of the first impurity diffusion layer.

To achieve the above mentioned object or objects, the present invention provides a semiconductor device which comprises a semiconductor substrate having a certain conductivity type, a first impurity diffusion layer formed in a region in the semiconductor substrate surrounded by a field oxide layer, the first impurity diffusion layer having the opposite conductivity type to that of the semiconductor substrate, a second impurity diffusion layer formed to cover the first impurity diffusion layer, the second impurity diffusion layer having the opposite conductivity type to that of the semiconductor substrate and an impurity concentration higher than that of the first impurity diffusion layer, a plurality of third impurity diffusion layers formed on a surface of the second impurity diffusion layer and electrodes connected to the third impurity diffusion layers.

To achieve the above mentioned object or objects, the present invention provides a method for manufacturing a semiconductor device, which comprises the steps of preparing a semiconductor substrate of a certain conductivity type or a well formed in the semiconductor substrate; forming a first impurity diffusion layer on a surface of the semiconductor substrate or a surface of the well; forming a field oxide layer on the semiconductor substrate to surround the first impurity diffusion layer; carrying out ion implantation in such a manner not to penetrate into the first impurity diffusion layer to thereby form a channel stop; forming a second impurity diffusion layer on a surface of the first impurity diffusion layer, with the field oxide layer as mask, the second impurity diffusion layer having the opposite conductivity type and an impurity concentration higher than that of the first impurity diffusion layer; forming a plurality of third impurity diffusion layers of the opposite conductivity type on the second impurity diffusion layer; and disposing electrodes connected to the third impurity diffusion layers.

With the above mentioned arrangements of the semiconductor device implementing the present invention, high breakdown voltage enhancement is achieved by widening a portion of the impurity diffusion layer having a larger curvature at the boundary between a plurality of the impurity diffusion layers and thus a determinative factor of the breakdown voltage of the semiconductor device. On the other hand, current drive power is enhanced by narrowing the remaining portion of the impurity diffusion layer having a smaller curvature and thus a determinative factor of the current drive power.

The semiconductor resistor device is composed of the two impurity diffusion layers connected in parallel with each other. A primary variance in the resistance value thereof is determined by variance in the low resistance impurity diffusion layer. Therefore, it is possible to further suppress such variance in the resistance value by increasing the impurity concentration of the low resistance impurity diffusion layer.

High breakdown voltage feature of the semiconductor resistor device is implemented by disposition of the field oxide layer at the boundary between the impurity diffusion layer and the semiconductor substrate or the well.

It is further possible to make high breakdown voltage and high accuracy semiconductor resistor devices with mere addition of an ion implantation step to the conventional CMOS process because the field oxide layer may be used as mask in forming the impurity diffusion layers.

Additional features of the present invention are described in relation to the description of the preferred embodiments of the present invention.

DETAILED DESCRIPTION OF PREFERRED EMBODIMENTS OF THE INVENTION

Figure 1:
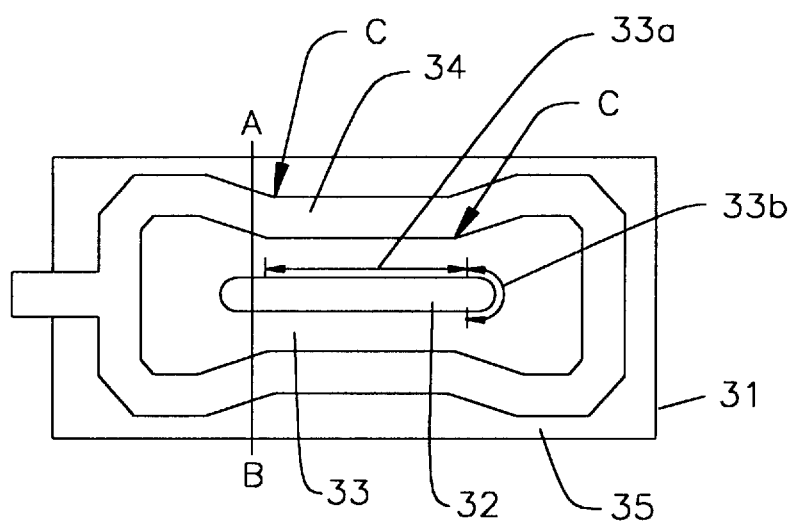
FIG. 1 is a plan view of a semiconductor device according to an embodiment of the present invention.
Figure 2:
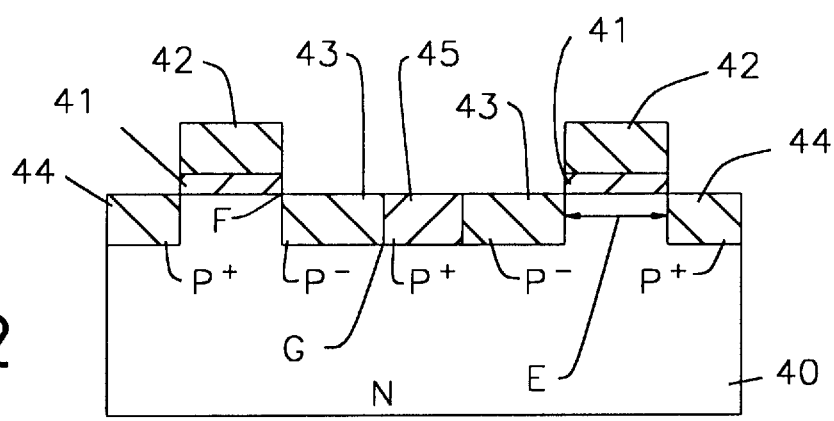
FIG. 2 is a cross sectional view of the semiconductor device according to the embodiment of the present invention.

Referring to the accompanying drawings, there is illustrated an embodiment of the present invention. FIG. 1 is a plan view of a high breakdown voltage semiconductor device according to an embodiment of the present invention and FIG. 2 is a cross sectional view along the line AB in FIG. 1.

A high breakdown voltage semiconductor device is formed within a desired region 31 (a rectangular region in the illustrated embodiment) on a semiconductor substrate 30. An impurity diffusion layer 32 is formed at the center of the high breakdown voltage semiconductor device. The impurity diffusion layer 32 has a rounded or semi-circular configuration of a specific curvature at both ends thereof in a longitudinal direction thereof. The impurity diffusion layer 32 serves as drain.

An impurity diffusion layer 33 is disposed in the neighborhood and periphery of the impurity diffusion layer 32. The width of a region 33a of the impurity diffusion layer 33 in contact with the longitudinal sides of the impurity diffusion layer 32 is selected smaller than that of another region 33b in contact with the rounded end portions of the impurity diffusion layer 32. It is noted that the curvature of the longitudinal side is smaller than the curvature of the two ends of the impurity diffusion layer 32 (i.e., the curvature of the former is approximately zero). In other words, the width of the region 33a of the impurity diffusion layer 33 having such a smaller curvature is narrower than that of the curved region 33b of the impurity diffusion layer 33. In the illustrated embodiment, the width of the less-curved region of the impurity diffusion layer 33 is 3 μm and the width of the much-curved region is 4 μm.

The reason why the width of the impurity diffusion layer 33 is varied base upon the difference in the curvature is the inventors' discover that the breakdown voltage of the curved region of the impurity diffusion layer at the two ends of the impurity diffusion layer 32 is lower than the breakdown voltage of the less-curved region. If individual ones of impurity diffusion layers were all rectangular shaped and formed at equal distance from the center one of the impurity diffusion layers as seen in the prior art device, electric fields would have been concentrated on the four corners of the individual impurity diffusion layers because of a larger curvature at the four corners. Thus, in the prior art semiconductor device the breakdown voltage was limited due to the configuration of the four corners and was not be as high enough as the present invention is to achieve.

Figure 3:
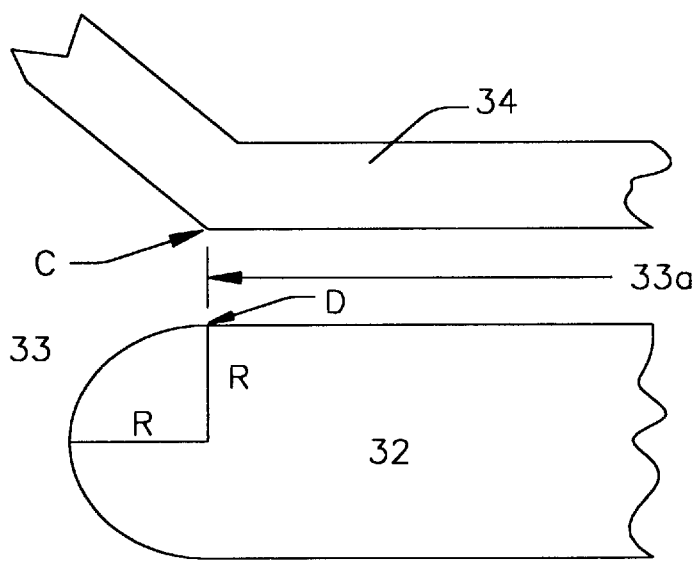
FIG. 3 is an enlarged view of an impurity diffusion layer of the semiconductor device according to the embodiment of the present invention.

FIG. 3 is an enlarged view of an end portion of the impurity diffusion layer 32. The end portion of the impurity diffusion layer 32 has curvature R. In the illustrated embodiment, the end portion of the impurity diffusion layer 32 has a semi-circular configuration with radius R. Where the point of contact between the semi-circle and the longitudinal side is D, the position C of a narrower portion of the region 33a or a gate electrode 34 may be on an extension of a line running from the center of the semi-circle and the position D or short of the extension or closer to the liner region 33a. In the illustrated embodiment, the curvature of the longitudinal region is 0 and the curvature of the semi-circular end region is $0.62 \times 10^6 m^{-1}$.

The gate electrode 34 of a fixed width is formed in the periphery of the impurity diffusion layer 33. An impurity diffusion layer 35 is further formed outside the gate electrode 34.

Referring to FIG. 2, the semiconductor device of the present invention will be described in more detail.

Figure 4:
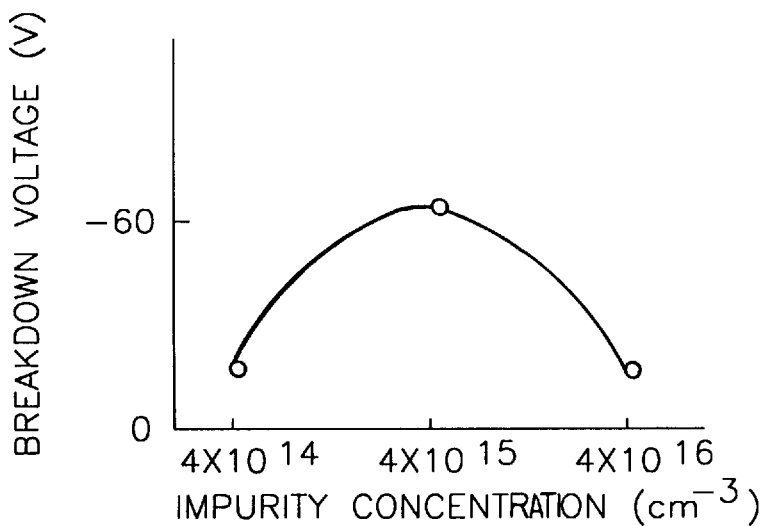
FIG. 4 is a graph showing the relationship between the breakdown voltage and impurity concentration in the semiconductor device according to the present invention.

A semiconductor substrate 40 is prepared which comprises an N type silicon substrate with an impurity concentration of approximately $4 \times 10^{15}.cm^{-3}$ and a surface orientation of (100). It is noted that the impurity concentration of the semiconductor substrate 40 is selected low to meet high breakdown voltage requirement (about −60 V in the illustrated embodiment). It is, however, required that the impurity concentration of the substrate be high enough not to cause punch-through of impurity diffusion layers 43 and 44 to be described below when the semiconductor device is enabled. If necessary, a step is taken to control the impurity concentration so as to attain a desired value thereof (for example, ion implantation). FIG. 4 is a graph showing the relationship between breakdown voltage and impurity concentration, suggesting that about $4 \times 10^{15}$ cm$^{-3}$ of impurity concentration is needed to attain approximately 60 V of breakdown voltage. The graph also suggests that the semiconductor device exhibits −20 V or more of breakdown voltage when the impurity concentration is at $4 \times 10^{14}$ cm$^{-3}$ or $4 \times 10^{16}$ cm$^{-3}$.

An insulating layer 41 is disposed on the semiconductor substrate 40. The thickness of the insulating layer 41 is approximately 50 nm. A gate electrode 42 is disposed over the semiconductor substrate 40 via the insulating layer 41. The gate electrode 42 is approximately 400 nm thick and composed of polysilicon. The gate electrode 42 is ring-shaped.

Figure 5:
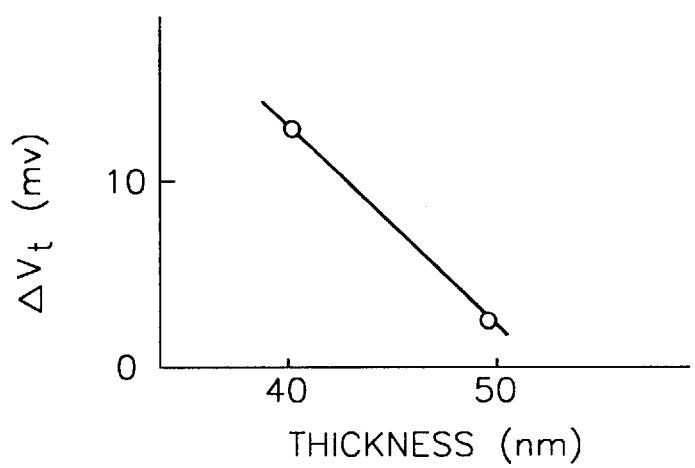
FIG. 5 is a graph showing the relationship between the thickness of an insulating layer and difference in threshold voltage in the semiconductor device according to the present invention.

The insulating layer 41 is selected to be thick enough to prevent fluctuations in threshold voltage and drain current due to the aging of the high breakdown voltage semiconductor device. FIG. 5 is a graph showing the relationship between the thickness of the insulating layer 41 and fluctuations in threshold voltage. It is evident that fluctuations in threshold voltage decrease as the thickness increases. To suppress the impact of the aging of the high breakdown voltage semiconductor device, the thickness of the insulating layer 41 is on the order of 30 to 100 nm. The gate length of the ring-shaped gate electrode 42 is selected to be 2 $\mu$m in order to provide sufficient current drive power and prevent possible punch-through between the impurity diffusion layers 43 and 44. The gate length is defined as the distance between a side etch of the impurity diffusion layer 43 and a facing side etch of the impurity diffusion layer 44. It is, however, noted that the gate length is in inverse proportion to the current drive power. In the given example, the current drive power is approximately –30 $\mu$A/$\mu$m.

The impurity diffusion layer 43 is disposed on a surface of the semiconductor substrate 40 and located inside the ring-shaped gate electrode 42. The impurity concentration of the impurity diffusion layer 43 is approximately $1 \times 10^{17}$ cm$^{-3}$. The impurity concentration of the impurity diffusion layer 43 is one of determinative factors of the breakdown voltage. The maximum breakdown voltage is attained if the distribution of an electric field appearing in the impurity diffusion layer 43 is made equal in a horizontal direction. In other words, the electric field distribution in the impurity diffusion layer 43 is equal in the lateral direction on the drawing sheet of FIG. 2. Should the impurity concentrations of the semiconductor substrate 40 and the impurity diffusion layer 43 be fixed or constant, the width of the impurity diffusion layer 43 becomes a decisive factor of the breakdown voltage. A voltage drop in the impurity diffusion layer 43 in a horizontal direction (from the impurity diffusion layer 44 to another impurity diffusion layer 45) is approximately –30 V/$\mu$m.

Figure 6:
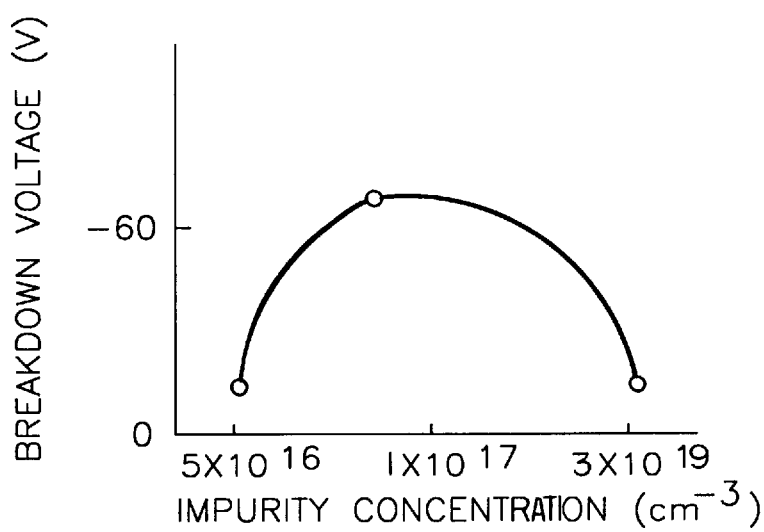
FIG. 6 is a graph showing the relationship between the impurity concentration of an impurity diffusion layer and breakdown voltage in the semiconductor device according to the present invention.

The relationship between the impurity concentration of the impurity diffusion layer 43 and the breakdown voltage which meet the above discussed criteria is illustrated in FIG. 6. The breakdown voltage exhibits a convex curve against the impurity concentration. To secure the maximum breakdown voltage (–60 V), the impurity concentration should be approximately $1 \times 10^{17}$ cm$^{-3}$. If it is desired to secure 20 V or more of breakdown voltage, the impurity concentration is within a range between $5 \times 10^{16}$ cm$^{-3}$ and $3 \times 10^{17}$ cm$^{-3}$. The location where the breakdown voltage is determined or limited varies depending upon the impurity concentration value. When the impurity concentration is $3 \times 10^{17}$ cm$^{-3}$ or more, the breakdown voltage at the point F in FIG. 2 is lowest. When the impurity concentration is $5 \times 10^{16}$ cm$^{-3}$ or less, the breakdown voltage at the point G is lowest. Decrease in the width of the impurity diffusion layer 43 causes decrease in the breakdown voltage in proportional manner. For this reason, the width of the impurity diffusion layer 43 should be at least 2 $\mu$m or more in order to achieve a breakdown voltage as high as –60 V. In the illustrated embodiment, the width is selected with a certain allowance to be 3 $\mu$m or more.

The impurity diffusion layer 45 is disposed on the surface of the semiconductor substrate 40 and located inside the impurity diffusion layer 43. The impurity diffusion layer 45 comprises a heavily doped P$^+$ type diffusion layer and serves as drain. It is noted that the impurity diffusion layer 44 is disposed on the surface of the semiconductor substrate 40 and located outside the ring-shaped gate electrode 42. The impurity diffusion layer 44 comprises a relatively high impurity concentration P$^+$ type diffusion layer and serves as source. It is to be noted that although the same components are shown in FIGS. 1 and 2, they are designated by the reference numbers.

The high breakdown voltage semiconductor device according to the above illustrated embodiment will operate as follows:

When the high breakdown voltage semiconductor device is in non-conducting state and high voltage is applied to the impurity diffusion layer 45, the impurity diffusion layer 43 becomes a depletion layer and exhibits a voltage drop. As a result, the voltage which develops at a PN junction between a region of the semiconductor substrate 40 beneath the ring-shaped gate electrode 42 and the impurity diffusion layer 43 and thus at a side wall of the impurity diffusion layer 43 including the point F in FIG. 2 and limits the breakdown voltage, becomes lower than the voltage applied to the impurity diffusion layer 45 by the voltage drop in the impurity diffusion layer 43. This enables high breakdown voltage implementations.

What limits the breakdown voltage in topography of the impurity diffusion layer 43 is not the width of the region having a small curvature but the width of the region having a large curvature. In the illustrated embodiment, the width of the impurity diffusion layer 43 is 3 $\mu$m at the region having the small curvature and 4 $\mu$m at that having the large curvature. By widening the region having the large curvature from 3 $\mu$m to 4 $\mu$m, it becomes possible to attain a high breakdown voltage of –60 V or more with minimum manufacturing deviation and high stability.

When the high breakdown voltage semiconductor device is in conducting state and high voltage is applied to the impurity diffusion layer 45, current runs from the impurity diffusion layer 44 to the impurity diffusion layer 45 by way of the impurity diffusion layer 43. The current tends to flow through the region 33a of the impurity diffusion layer 43 in FIG. 1 which is larger in length and narrower in width and has a smaller parasitic resistance and a smaller curvature in comparison with the much-curved region, thereby enhancing the current drive power performance of the high breakdown voltage semiconductor device. In the illustrated embodiment, the current drive power attained is –30 $\mu$A/$\mu$m when the gate length of the ring-shaped gate electrode 42 is 2 $\mu$m and the width of the region of the impurity diffusion layer 43 is 3 $\mu$m.

Figure 7:
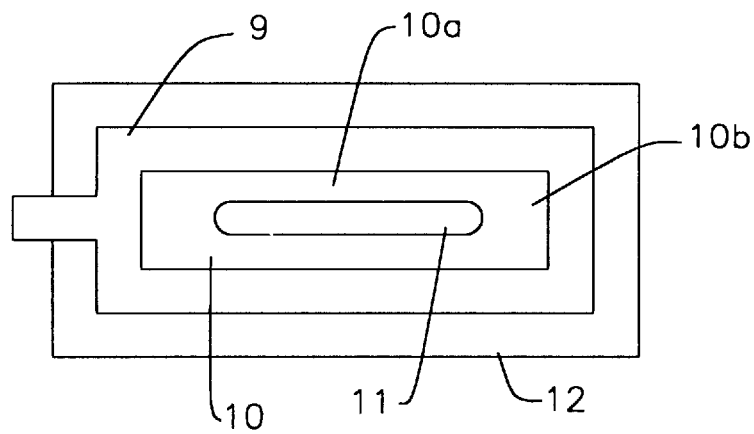
FIG. 7 is a plan view of a semiconductor device according to a second embodiment of the present invention.

Although in the above illustrated embodiment the region of the impurity diffusion layer having the large curvature is widened in both a vertical and horizontal direction, it is obvious to those skilled in the art that 4that region may be widened only in a horizontal direction as depicted in FIG. 7.

Moreover, the above illustrated embodiment is designed to enhance the high breakdown voltage property of the semiconductor device by controlling the current flowing between the impurity diffusion layers 45 and 44. Provided, however, that the impurity concentration of the impurity diffusion layer 32 or 45 is properly adjusted and two terminals are connected to both ends of the impurity diffusion layer 32 or 45 to utilize a voltage drop in the two terminals, the impurity diffusion layer 32 or 45 may be used a high breakdown voltage diffusion resistor.

Another embodiment of the present invention will be discussed with reference to the drawings.

Figure 8A:
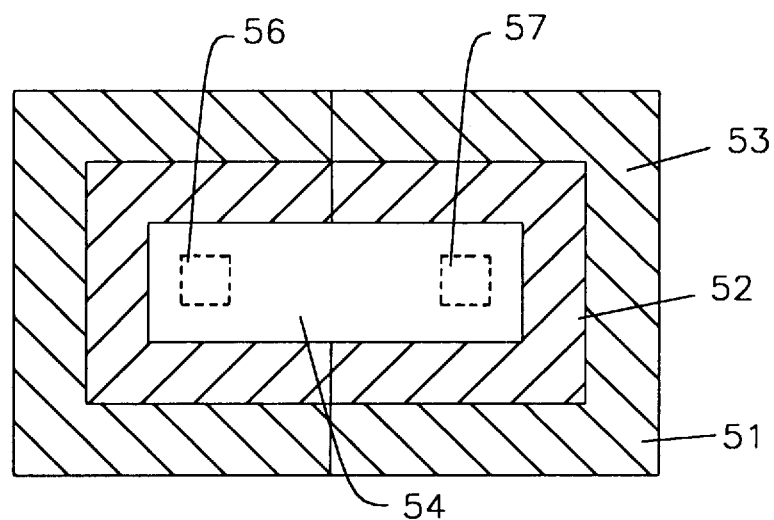
FIGS. 8(a) and 8(b) are a plan view and a cross sectional view of the semiconductor device according to the second embodiment of the present invention.
Figure 8B:
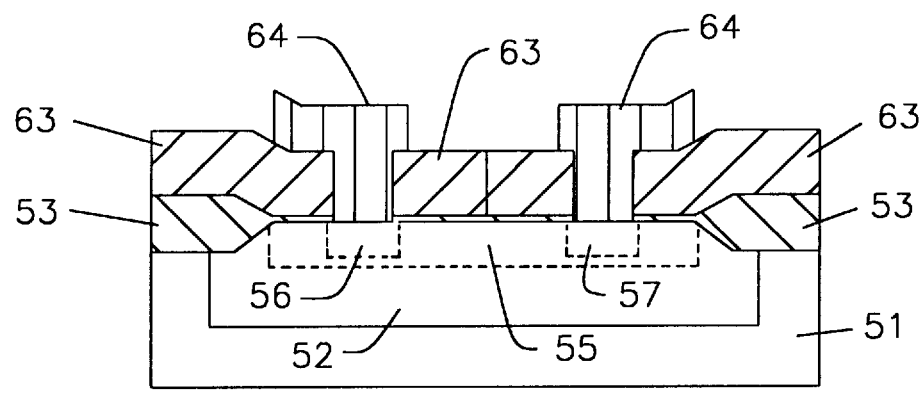

FIGS. 8(a) and 8(b) are a plan view and a cross sectional view of a semiconductor resistor device according to the alternative embodiment of the present invention. A structure of the semiconductor resistor device will be described referring to FIGS. 8(a) and 8(b).

An impurity diffusion layer 52 is a P type diffusion layer disposed on a surface of an N type silicon semiconductor substrate (specific resistance: 10 Ωcm), which layer serves as a primary component of the semiconductor resistor device. The impurity concentration of the impurity diffusion layer 52 is selected to rest between $1\times 10^{15}$ cm$^{-3}$ and $1\times 10^{17}$ cm$^{-3}$, with a diffusion depth of approximately 3 μm to 5 μm. A PN junction between the surface of the semiconductor substrate 51 and the impurity diffusion layer 52 lies beneath a field oxide layer 53. With this arrangement, a breakdown voltage as high as −80 V may be attained between the semiconductor substrate 51 and the impurity diffusion layer 52. At this time, the semiconductor substrate 51 is connected to Vcc power supply (+5 V). Should the impurity concentration and depth of the impurity diffusion layer 52 be selected within the above identified ranges, the resistance obtained will be approximately 100 kΩ and the breakdown voltage approximately −60 V.

An active region 54 is a region on the impurity diffusion layer 52 which is not covered with the field oxide layer 53. A P type impurity diffusion layer 55 with an intermediate impurity concentration is formed in the active region 54. The impurity concentration of the impurity diffusion layer 55 is selected to be higher than the surface impurity concentration of the impurity diffusion layer 52 and particularly approximately $1\times 10^{17}$ cm$^{-3}$, with a diffusion depth of about 0.5 μm. Whereas the impurity concentration of the impurity diffusion layer 55 may be selected within the above defined range in order to secure a resistance of 100 kΩ, it is required that the value of the impurity concentration be higher than that of the impurity diffusion layer 52 and lower than that of third impurity diffusion layers 56, 57.

The impurity diffusion layers 56, 57 of P type having a high impurity concentration are disposed in the active region 54 via the impurity diffusion layer 55. The impurity diffusion layers 56, 57 are provided to make electric ohmic contact between the impurity diffusion layers 52 and 55. The impurity concentration of the impurity diffusion layers 56, 57 selected is approximately $1\times 10^{21}$ cm$^{-3}$.

Aluminum electrodes 64 are connected to the third impurity diffusion layers 56, 57 via an interlayer isolation layer 63. The semiconductor resistor device illustrated herein is considered to consist of the impurity diffusion layers 52 and 55 or two resistors connected in parallel. Assume now that $R_1$ and $\Delta R_1$ are the resistance of the impurity diffusion layer 52 and its deviation and $R_2$ and $\Delta R_2$ are the resistance of the impurity diffusion layer 55 and its deviation. $R_0$ and $\Delta R_0$ are the resistance of the two combined resistances and its deviation. $R_0$ may be represented by equation (1). The individual deviations ($\Delta R_1$, $\Delta R_2$) may be rewritten into the combined deviation ($\Delta R_0$) as represented by equation (2).

$$R_o = \frac{R_1 \cdot R_2}{R_1 + R_2} \quad \text{equation (1)}$$

$$\Delta R_o^2 = \left[\frac{\partial R_o}{\partial R_1}\right]^2 X\Delta R_{12} + \left[\frac{\partial R_o}{\partial R_2}\right]^2 X\Delta R_{22} \quad \text{equation (2)}$$

$$= \left[\frac{R_2}{R_1+R_2}\right]^4 X\Delta R_{12} + \left[\frac{R_1}{R_1+R_2}\right]^4 X\Delta R_{22}$$

Provided $R_1 > R_2$, $\Delta R_0$ is dominated primarily by $\Delta R_2$. Provided further $\Delta R_1 > \Delta R_2$, the deviation will be smaller than when the impurity diffusion layer 52 or 55 is provided alone.

Even if the deviation of the resistance of the impurity diffusion layer 52 is appreciable, the semiconductor resistor device may be implemented with a minimum of deviation as a whole as long as the impurity concentration of the impurity diffusion layer 55 is higher than that of the impurity diffusion layer 52 to suppress the deviation of the resistance of the impurity diffusion layer 55 as much as possible.

Figure 9A:
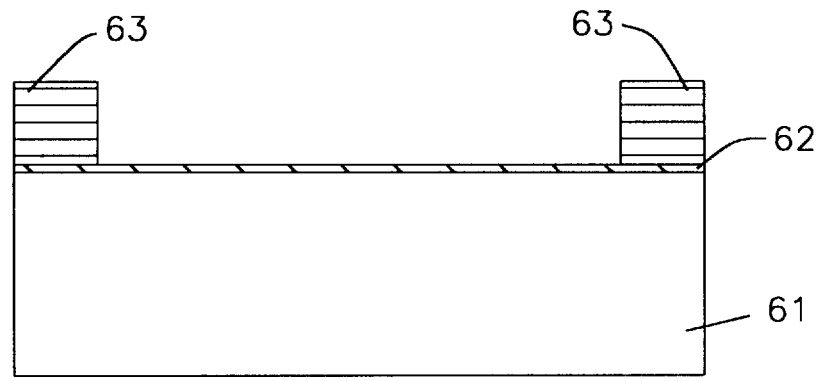
FIGS. 9(a) to 9(c) are cross sectional views of a semiconductor device according to still another embodiment of the present invention.
Figure 9B:
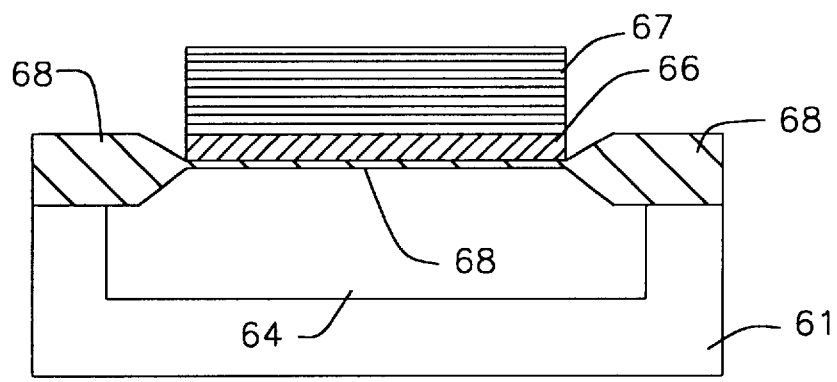
Figure 9C:
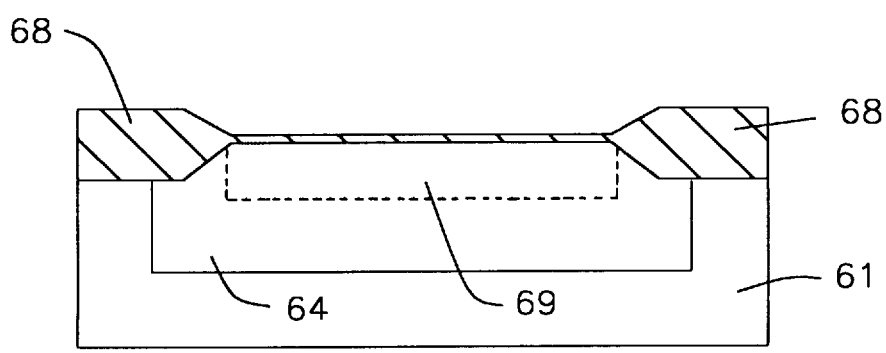

FIGS. 9(a) to 9(c) are cross sectional views showing a method of manufacturing a semiconductor resistor device according to another embodiment of the present invention. The manufacturing method will be discussed referring to FIGS. 9(a) to 9(c).

A semiconductor substrate 61 is an N type silicon substrate (specific resistance: 10 Ωcm). The semiconductor substrate 61 is thermally oxidized at 900 ° C. to form a protective oxide layer 62 of approximately 20 nm. A resist 63 is applied and patterned with the lithography technology. With the resist 63 as mask, boron is implanted on the order of $1.0\times 10^{13}$ cm$^{-2}$. Acceleration voltage used for ion implantation is 20 keV to 50 keV. With acceleration voltage of less than 20 keV, sufficient ions are not implanted into the substrate 61. On the other hand, acceleration voltage of higher than 50 keV makes the impurity concentration on a surface of the substrate 61 instable. After removal of the resist 63, oxidation and well drive-in are effected at 1050° C.–1200° C. to diffuse thermally boron and form an impurity diffusion layer 64 (FIG. 9(a)). The impurity diffusion layer 64 has an impurity concentration of approximately $5\times 10^{16}$ cm$^{-3}$ and a diffusion depth of approximately 3 μm. The impurity diffusion layer 64 is formed simultaneously with formation of a P type well where transistors or the likes are formed, whereby the need is eliminated for the steps of masking and ion implantation in order to form the impurity diffusion layer 64 and additional expenditures of manufacturing steps and cost are avoided.

After the protective coating 62 is etched away, a new underlying oxide layer 65 is formed and a silicon nitride layer 66 is grown by the CVD technique. A resist 67 is applied and the lithography technique defines and patterns a field region. With the resist 67 as mask, the silicon nitride layer 66 is patterned. Phosphorus is implanted on the order of approximately $0.5–1.0\times 10^{12}$ cm$^{-2}$ to form a channel stop for element isolation of P channel transistors. The dose amount of phosphorus in the above defined range is appropriate to secure −60 V or higher of breakdown voltage of the semiconductor resistor device.

Precaution is taken to prevent boron implantation for channel stop formation for element isolation of N channel transistors from penetrating through the impurity diffusion layer 64. Unlike the prior art semiconductor device where a resistor is composed of an impurity diffusion layer for a channel stop, the semiconductor resistor device of the present invention is composed of the impurity diffusion layer 64 and an impurity diffusion layer 69. After the resist 67 is removed, a field oxide layer 68 of about 500 nm is grown for element isolation by the thermal oxidation (FIG. 9(b)).

Thereafter, the silicon nitride layer 66 and the underlying oxide layer 65 are etched away. Boron is implanted on the order of $2.0 \times 10^{12}$ cm$^{-2}$ to form the impurity diffusion layer 69 while the field oxide layer 68 as shown in FIG. 8(a) is used as mask (FIG. 9(c)).

The impurity concentration of the impurity diffusion layer 69 is approximately $1.0 \times 10^{17}$ cm$^{-3}$, with a diffusion depth of approximately 0.3 μm. No high temperature thermal treatment in excess of 900° C. takes place after the formation of the impurity diffusion layer 69. Any effect of the thermal treatment such as segregation and diffusion is not seen so that the deviation of the resistance value of the impurity diffusion layer 69 may be minimized.

Only one step of ion implantation should be added to the state-of-art CMOS manufacturing process, because the impurity diffusion layer 69 is formed and self-aligned with the field oxide layer 68 as mask, without relying a mask formed with the lithography process.

A resist is applied and a P type drain diffusion layer is patterned. With the resist as mask, BF$_2$ is implanted on the order of $1.0 \times 10^{15}$ cm$^{-2}$ to form impurity diffusion layers 70, 71. The impurity diffusion layers 70, 71 are overlaid with an interlayer isolation layer 72 and aluminum electrodes 73 as is obvious from FIG. 8(b).

Figure 10:
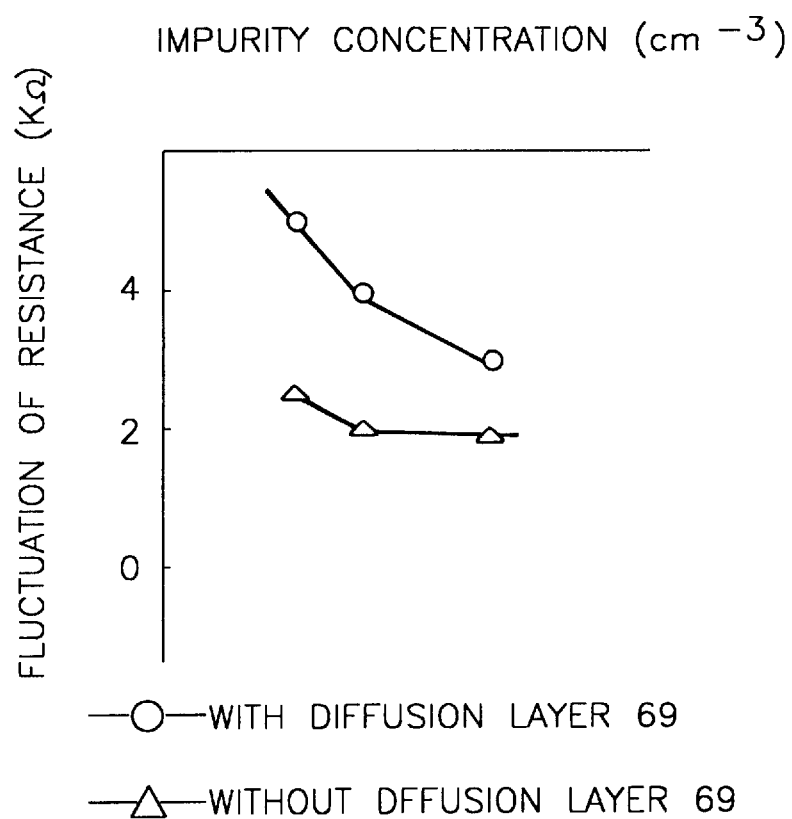
FIG. 10 is a graph showing the relationship between the impurity concentration of an impurity diffusion layer and variance in resistance value in the semiconductor device according to the present invention.

The inventors' experiments indicate that when the width of the impurity diffusion layer 64 is 12 μm, the width of the active region is 3 μm, the distance between the impurity diffusion layers is 50 μm, the semiconductor resistor device made by the above mentioned manufacturing process exhibits a resistance of 40±3 KΩ, a breakdown voltage as high as −80 V and a minimum deviation of resistance. The resistance deviation is reduced to less than a half of the counterpart when only the impurity diffusion layer 64 is formed (i.e., the absence of the impurity diffusion layer 69. The results are shown in FIG. 10 with abscissa plotting the impurity concentration of the impurity diffusion layer 64 and ordinate plotting the resistance deviation. The symbol ○ in FIG. 10 shows the resistance deviation in the absence of the impurity diffusion layer 69 and the symbol Δ shows that in the presence of the impurity diffusion layer 69. The results suggest the tendency of the resistance deviation to depend upon the impurity concentration of the impurity diffusion layer 64 and decrease with an increase in the impurity concentration thereof. It is also evident that the resistance variation is smaller in the presence of the impurity diffusion layer 69 than that in the absence thereof. Put in another way, the formation of the impurity diffusion layer 69 helps in suppressing the resistance variation.

Figure 11:
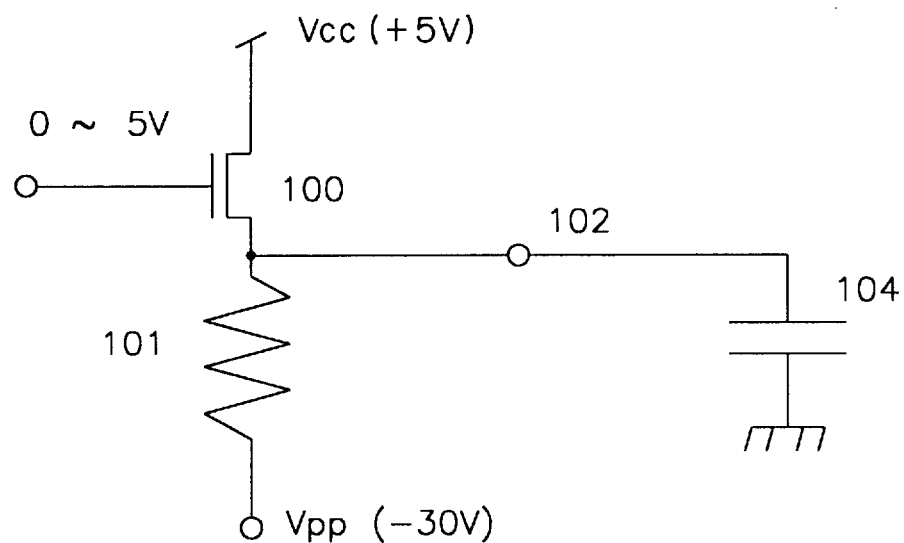
FIG. 11 is a circuit diagram of an input/output circuit using the semiconductor device according to the present invention.
Figure 12:
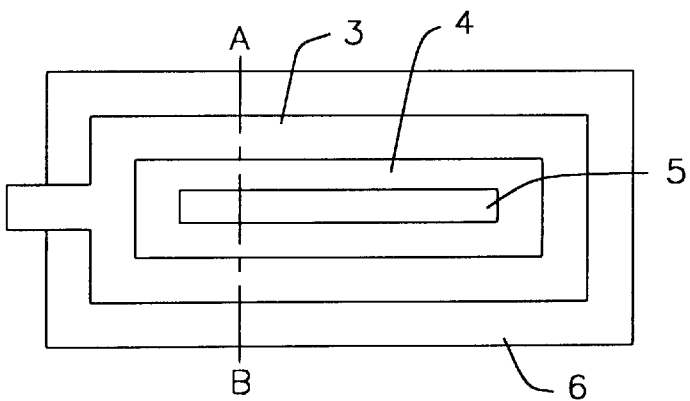
FIG. 12 is a plan view of a conventional high breakdown voltage semiconductor device.
Figure 13:
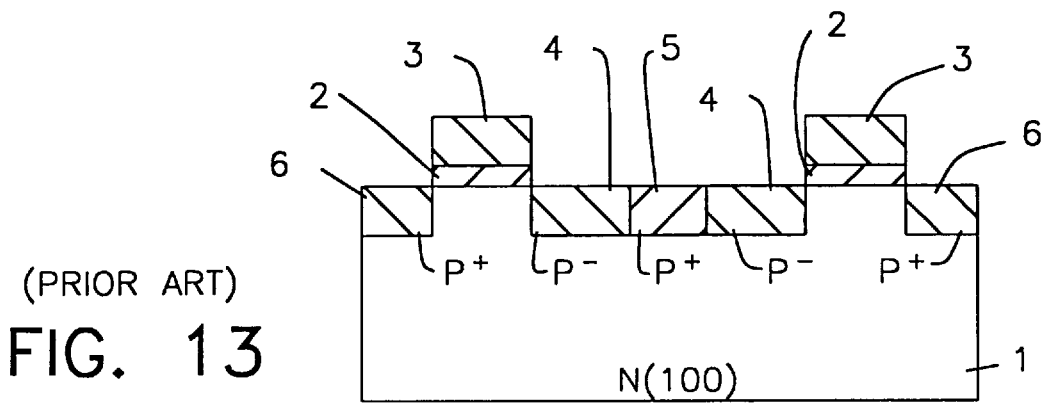
FIG. 13 is a cross sectional view of the conventional high breakdown voltage semiconductor device.
Figure 14A:
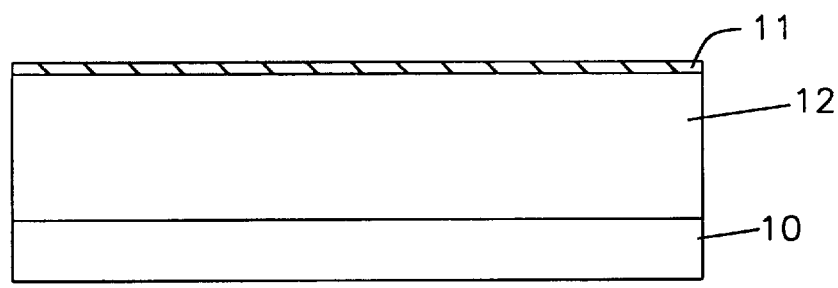
FIGS. 14(a) to 14(d) are cross sectional views of a conventional high breakdown voltage semiconductor device.
Figure 14B:
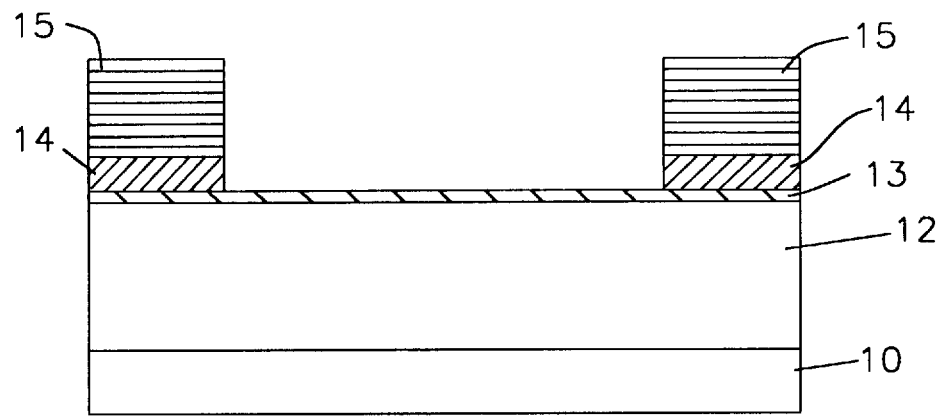
Figure 14C:
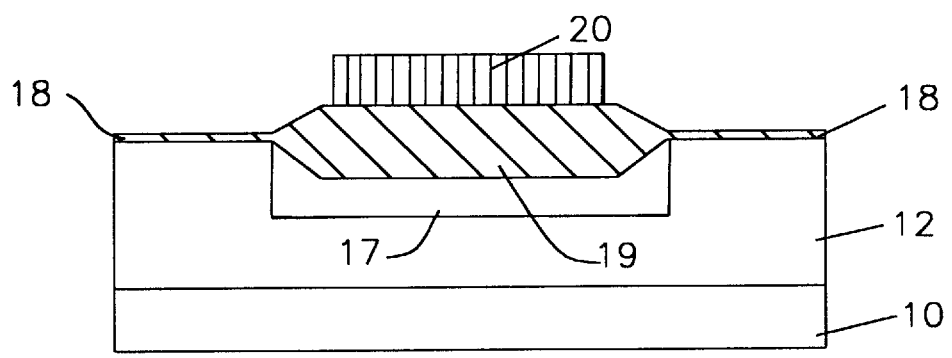
Figure 14D:
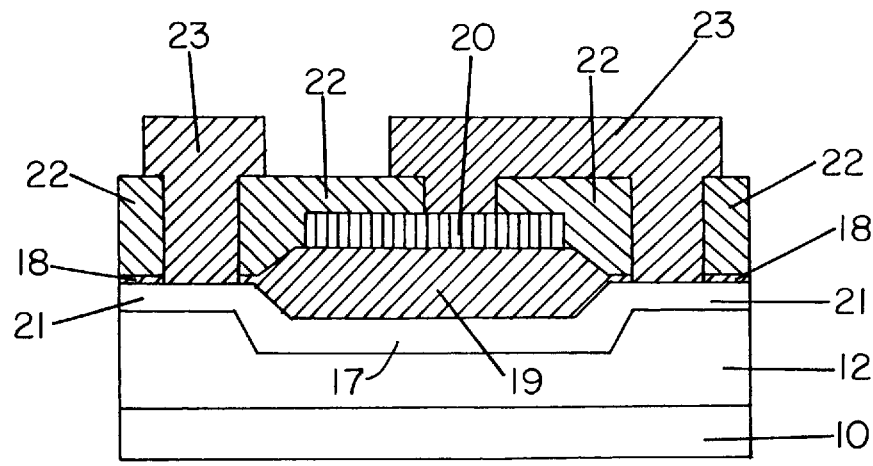
Figure 15:
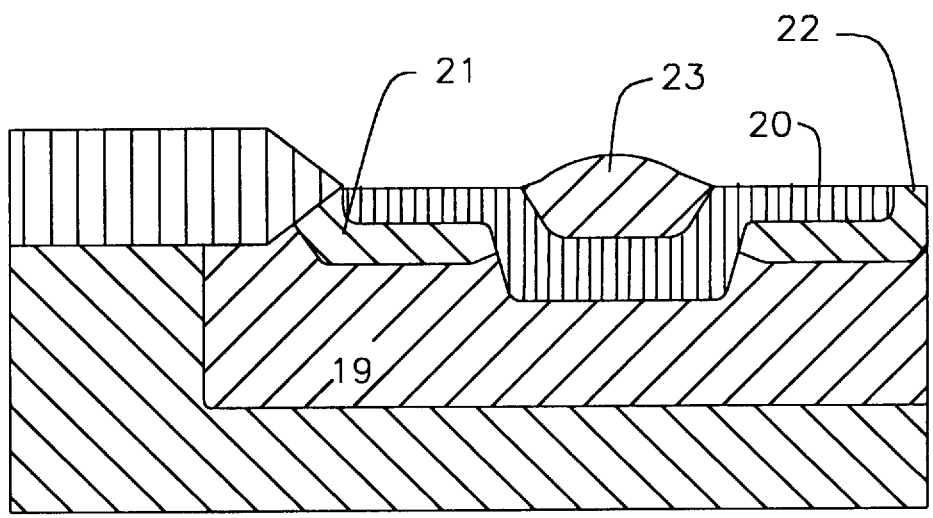
FIG. 15 is a cross sectional view of a conventional high breakdown voltage semiconductor device.

Referring to FIG. 11, there is illustrated an input/output circuit using the semiconductor resistor device as illustrated above. A P channel transistor 100 has a source connected to Vcc power supply (+5 V) and a drain connected to an output terminal 102 and one end of a semiconductor resistor device 101. The other end of the semiconductor resistor device is connected to Vpp power supply (−30 V). The output terminal 102 is connected to a fluorescent display tube which may be considered an equivalency of a capacitor 104.

When the P channel transistor 100 is in conducting state, the potential at the output terminal 102 goes up to near Vcc. When the same is in non-conducting state, it decreases down to Vpp. While the potential at the output terminal 102 stays in the range from +5 V to −30 V in the normal operation mode, the potential at the output terminal 102 may fall twice as much as Vpp and thus −60 V when a capacitive spike-like noise appears between the terminals. Therefore, the semiconductor resistor device is required to assume −60 V or more of breakdown voltage.

When the P channel transistor 100 is in conducting state, it is preferable that the semiconductor resistor device 101 have a higher resistance value in order to make current flowing from Vcc to Vpp as small as possible. On the other hand, a smaller resistance value of the semiconductor resistor device 101 is preferable because of the necessity to discharge a charge on the capacitor 104 as quickly as possible when the P channel transistor 100 is not conductive. For those reasons, it is desirable that the breakdown voltage of the semiconductor resistor device 101 be −60 V or more and the resistance value thereof be within the range from 20 to 150 KΩ.

The semiconductor resistor device of FIGS. 8(a) and 8(b) corresponds to the semiconductor resistor device 101 in FIG. 11. The device is used as a high breakdown voltage and high accuracy semiconductor resistor device for an inverter circuit which supplies high voltage.

To secure stability of the resistance value, a polysilicon gate or aluminum gate may be disposed on the impurity diffusion layer 64 via at least the field oxide layer 68. Whereas the semiconductor resistor device is formed on the semiconductor substrate 61 in the above illustrated embodiment, it may be formed in a well region. Although the semiconductor resistor device is made up of the P type diffusion layer in the above embodiment, it is obvious to those skilled in the art that the resistor device may be formed by an N type diffusion. In the latter, the semiconductor substrate 61 or a well is of P type with polarity reversal of the power supplies.

According to the teachings of the present invention, excellent high breakdown voltage semiconductor devices which have sufficient breakdown voltage and current drive power may be provided by changing the width of the impurity diffusion layer on the basis of the difference in curvature. The present invention makes great contribution toward enhancement of breakdown voltage and higher degree of integration of high breakdown voltage semiconductor devices.

The present invention also provides semiconductor resistor devices which have only a minimum of manufacturing deviation in resistance value. The semiconductor resistor device may be implemented without additional steps to the state-of-art CMOS manufacturing process by forming the impurity diffusion layer simultaneously with formation of a well region. The present invention provide a manufacturing technique by which semiconductor resistor devices are made with no or less manufacturing deviation in resistance value.

While preferred embodiments have been described, various modifications and substitutions may be made without departing from the spirit and scope of the invention. Therefore, it is understood that the present invention has been described by way of illustration and not limitation and the spirit and scope of the claims should not be limited to the description of the preferred embodiments.

What is claimed is:

1. A semiconductor device comprising
   (a) a semiconductor substrate of a certain conductivity type,
   (b) a gate electrode disposed on the semiconductor substrate via an insulating layer,
   (c) a first impurity diffusion layer disposed on a surface of the semiconductor substrate and located inside the gate electrode, said first impurity diffusion layer having the opposite conductivity type to that of the semiconductor substrate,
   (d) a second impurity diffusion layer disposed on the surface of the semiconductor substrate and located inside the first impurity diffusion layer, said second impurity diffusion layer having the opposite conductivity type to that of the semiconductor substrate and having a round configuration at both end portions thereof, wherein the first impurity diffusion layer has different curvatures at the boundary between the first and second impurity diffusion layers and wherein the width of a portion of the first impurity diffusion layer having a larger curvature is greater than that of another portion of the first impurity diffusion layer having a smaller curvature.

2. A semiconductor device as set forth in claim 1 wherein the curvature of the remaining portion of the second impurity diffusion layer other than the end portions is substantially zero.

3. A semiconductor device as set forth in claim 1 wherein the portion of the first impurity diffusion layer in contact with the rounded end portions of the second impurity diffusion layer is wider than the remaining portion of the first impurity diffusion layer in contact with the remaining portion of the second impurity diffusion layer.

4. A semiconductor device as set forth in claim 1 wherein the impurity concentration of the second impurity diffusion layer is higher than that of the first impurity diffusion layer.

5. A semiconductor device comprising
 (a) a semiconductor substrate of a certain conductivity type,
 (b) a gate electrode disposed on the semiconductor substrate via an insulating layer,
 (c) a first impurity diffusion layer disposed on a surface of the semiconductor substrate and located inside the gate electrode, said first impurity diffusion layer having the opposite conductivity type to that of the semiconductor substrate,
 (d) a second impurity diffusion layer disposed on the surface of the semiconductor substrate and located inside the first impurity diffusion layer, said second impurity diffusion layer having the opposite conductivity type to that of the semiconductor substrate and having a round configuration at both end portions thereof,
 (e) a third impurity diffusion layer disposed on the surface of the semiconductor substrate and located outside the gate electrode, said third impurity diffusion layer having the opposite conductivity type to that of the semiconductor substrate, wherein the second impurity diffusion layer serves as drain, the third impurity diffusion layer serves as source and the first impurity diffusion layer shows a voltage drop when the semiconductor device is in non-conducting state and high voltage is applied to the second impurity diffusion layer, wherein the first impurity diffusion layer has different curvatures at the boundary between the first and second impurity diffusion layers and wherein the width of a portion of the first impurity diffusion layer having a larger curvature is greater than that of another portion of the first impurity diffusion layer having a smaller curvature.

6. A semiconductor device as set forth in claim 5 wherein the gate electrode control current flowing between the second and third impurity diffusion layers.

7. A semiconductor device as set forth in claim 5 wherein the semiconductor substrate comprises an N type silicon substrate, the gate electrode comprises a poly-silicon layer, the first impurity diffusion layer comprises a $P^-$ type diffusion layer, the second and third impurity diffusion layers each comprises a $P^+$ type diffusion layer.

8. A semiconductor device as set forth in claim 5 wherein the first impurity diffusion layer and the second impurity diffusion layer provides a combined parallel resistor.

* * * * *